United States Patent
Wacyk

(10) Patent No.: US 10,950,178 B2
(45) Date of Patent: Mar. 16, 2021

(54) MICRODISPLAY WITH REDUCED PIXEL SIZE AND METHOD OF FORMING SAME

(71) Applicant: eMagin Corporation, Hopewell Junction, NY (US)

(72) Inventor: Ihor Wacyk, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 16/279,809

(22) Filed: Feb. 19, 2019

(65) Prior Publication Data
US 2019/0259337 A1    Aug. 22, 2019

Related U.S. Application Data

(60) Provisional application No. 62/632,920, filed on Feb. 20, 2018.

(51) Int. Cl.
*G09G 3/3258*    (2016.01)
*H01L 27/32*    (2006.01)
(Continued)

(52) U.S. Cl.
CPC ......... *G09G 3/3258* (2013.01); *G09G 3/3208* (2013.01); *H01L 21/8221* (2013.01);
(Continued)

(58) Field of Classification Search
CPC ............... G09G 3/3258; G09G 3/3208; G09G 2300/0426; G09G 2300/0465;
(Continued)

(56) References Cited

U.S. PATENT DOCUMENTS 9,627,371 B1 *    4/2017    Lam ...................... G06F 11/079
2007/0145367 A1    6/2007    Chen et al.
(Continued)

FOREIGN PATENT DOCUMENTS

WO    2017/038403 A1    3/2017

OTHER PUBLICATIONS

Authorized Officer: Kaveckaite, Ausra, International Search Report and Written Opinion issued in counterpart PCT application No. PCT/US2019/018671, dated May 21, 2019, 16 pp.
(Continued)

*Primary Examiner* — Andrew Sasinowski
(74) *Attorney, Agent, or Firm* — Kaplan Breyer Schwarz, LLP

(57) ABSTRACT

A vertically stacked pixel circuit is provided that includes a high voltage device for driving a pixel on an upper silicon layer, and low voltage circuitry (such as matrix addressing circuitry, data storage circuitry and uniformity compensation circuitry) on a lower silicon layer. The circuitry on the upper and lower silicon layers are electrically connected via a through-silicon via. This unique arrangement allows the high voltage device for driving a pixel to be physically located on top of the larger number of low voltage devices in the lower silicon layer in order to achieve a substantial reduction in overall pixel emission area. The vertically stacked pixel circuit is particularly suited for organic light-emitting diode microdisplays.

13 Claims, 5 Drawing Sheets

(51) Int. Cl.
    *H01L 27/088*    (2006.01)
    *G09G 3/3208*    (2016.01)
    *H01L 27/06*     (2006.01)
    *H01L 21/822*    (2006.01)

(52) U.S. Cl.
    CPC ........ *H01L 27/0688* (2013.01); *H01L 27/088* (2013.01); *H01L 27/3244* (2013.01); *G09G 2300/0426* (2013.01); *G09G 2300/0465* (2013.01); *H01L 27/3262* (2013.01)

(58) Field of Classification Search
    CPC .............. H01L 27/088; H01L 27/0688; H01L 21/8221; H01L 27/3244; H01L 27/3262
    See application file for complete search history.

(56) References Cited

U.S. PATENT DOCUMENTS

| | | |
|---|---|---|
| 2007/0296073 A1 | 12/2007 | Wu et al. |
| 2013/0146931 A1 | 6/2013 | Liu et al. |
| 2013/0168674 A1 | 7/2013 | Franzon et al. |
| 2014/0374879 A1* | 12/2014 | Chen ..................... H01L 21/302 257/532 |
| 2016/0141204 A1* | 5/2016 | Kawahara ........... H01L 29/4916 257/330 |
| 2016/0218046 A1* | 7/2016 | Or-Bach ............ H03K 19/1774 |
| 2016/0293644 A1 | 10/2016 | Sugimoto |
| 2016/0351642 A1* | 12/2016 | Dykaar ................... H01L 31/00 |
| 2016/0372463 A1* | 12/2016 | Xiong ................. H01L 21/2822 |
| 2017/0170224 A1* | 6/2017 | Huang ................ H01L 21/8221 |
| 2017/0358265 A1* | 12/2017 | Wang ................... G09G 3/3655 |

OTHER PUBLICATIONS

S.C. Tan et al., "Designing of Circuit Building Blocks for OLED-on-Silicon Microdisplays", "SID International Symposium Digest of Technical Papers", San Jose, CA, May 21-23, 2002, May 21, 2002, pp. 980-983, vol. 33, No. 2.

* cited by examiner

MICRODISPLAY WITH REDUCED PIXEL SIZE AND METHOD OF FORMING SAME

STATEMENT OF RELATED CASES

This application claims priority to U.S. Provisional Application Ser. No. 62/632,920, filed Feb. 20, 2018, whose entire disclosure is incorporated herein by reference.

FIELD OF THE INVENTION

The present invention relates displays in general, and, more particularly, to organic light-emitting diode (OLED) microdisplays with ultra-small pixel sizes.

BACKGROUND OF THE INVENTION

There is growing interest in building a display with ultra-small pixel sizes for applications such as virtual reality (VR) to improve the user experience. A common problem with existing head-mounted display (HMD) systems is user discomfort after prolonged use due to vergence accommodation conflict (VAC). Among the various solutions proposed to overcome VAC the most comprehensive is expected to be the light field display.

In the light field approach each pixel comprises multiple sub-pixels, each of which emits directional light. At any particular viewing angle only one (or a very few) of the sub-pixels contributes to the perceived resolution of the image as seen from that direction. As a result the required resolution of a light-field display is increased by the number of directions required for true depth perception.

In order to achieve adequate directional emission for a particular pixel resolution, a large enough number of sub-pixels must fit into the pixel area, leading to a need for a very small sub-pixel area. In some applications, a sub-pixel area as small as 2 µm×2 µm is required.

Using conventional silicon backplane technology the minimum sub-pixel area is limited to about 4 µm×4 µm (an area of 16 µm$^2$). This is primarily due to the use of >5V transistors in the pixel circuit that are needed to operate the OLED. In addition, the capacitor used in the pixel cell for storing the drive level over the duration of the frame cycle can occupy up to 50% of the cell area. Both the pixel transistors and the storage capacitor cannot be shrunk through scaling because the minimum dimensions they require are fixed by the breakdown fields needed to support the >5V operation.

As discussed above, a limiting factor in shrinking the OLED pixel circuit is the required area for components that are built on a conventional planar silicon chip. Thus, OLED-based microdisplays having pixels of only a few microns on a side are not achievable using existing planar silicon chip fabrication techniques.

SUMMARY OF THE INVENTION

An object of the invention is to solve at least the above problems and/or disadvantages and to provide at least the advantages described hereinafter.

One of the factors that limits the reduction of pixel size for microdisplays is the fact that their components are fabricated using conventional planar silicon chip technology.

The present invention provides a way around this limitation by constructing the pixel circuits using a three-dimensional (3D) assembly process rather than the two dimensions used in the planar processing used in standard silicon wafer fabrication. The three-dimensional (3D) pixel circuit of the present invention requires less physical space than conventional pixel circuits. Thus, the present invention enables the fabrication of OLED-based microdisplays with higher pixel densities than prior microdisplays.

An embodiment of the invention is a vertically stacked circuit, comprising: a lower portion comprising at least one low voltage transistor; and an upper portion, disposed above the lower portion, comprising at least one high voltage transistor; wherein the upper and lower portions are electrically connected via a single electrical connection.

Another embodiment of the invention is a vertically stacked pixel circuit, comprising: a lower portion comprising at least one low voltage transistor; and an upper portion, disposed above the lower portion, comprising at least one organic light-emitting diode (OLED) and pixel drive circuitry configured to drive the at least one OLED; wherein the upper and lower portions are electrically connected via a single electrical connection.

Another embodiment of the invention is a method of forming a vertically stacked pixel circuit, comprising: providing a first silicon substrate; forming at least low voltage circuitry and at least one via on the first silicon substrate; providing a second silicon substrate; forming high voltage circuitry and at least one via on the second silicon substrate; attaching the second silicon substrate on top of the first silicon substrate, wherein the at least one via on the second silicon substrate is aligned with the at least one via on the first silicon substrate to form a through-silicon via, and wherein the low voltage circuitry and the high voltage circuitry are electrically connected via the through-silicon via; and fabricating at least one organic light-emitting diode on the second silicon substrate.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

In the following detailed description of various embodiments of the system and method of the present invention, numerous specific details are set forth in order to provide a thorough understanding of various aspects of one or more embodiments. However, the one or more embodiments may be practiced without some or all of these specific details. In other instances, well-known methods, procedures, and/or components have not been described in detail so as not to unnecessarily obscure aspects of embodiments.

While preferred embodiments are disclosed, still other embodiments of the system and method of the present invention will become apparent to those skilled in the art from the following detailed description, which shows and describes illustrative embodiments. As will be realized, the following disclosure is capable of modifications in various obvious aspects, all without departing from the spirit and scope of the present invention. Also, the reference or non-reference to a particular embodiment of the invention shall not be interpreted to limit the scope of the present invention.

Figure 1:
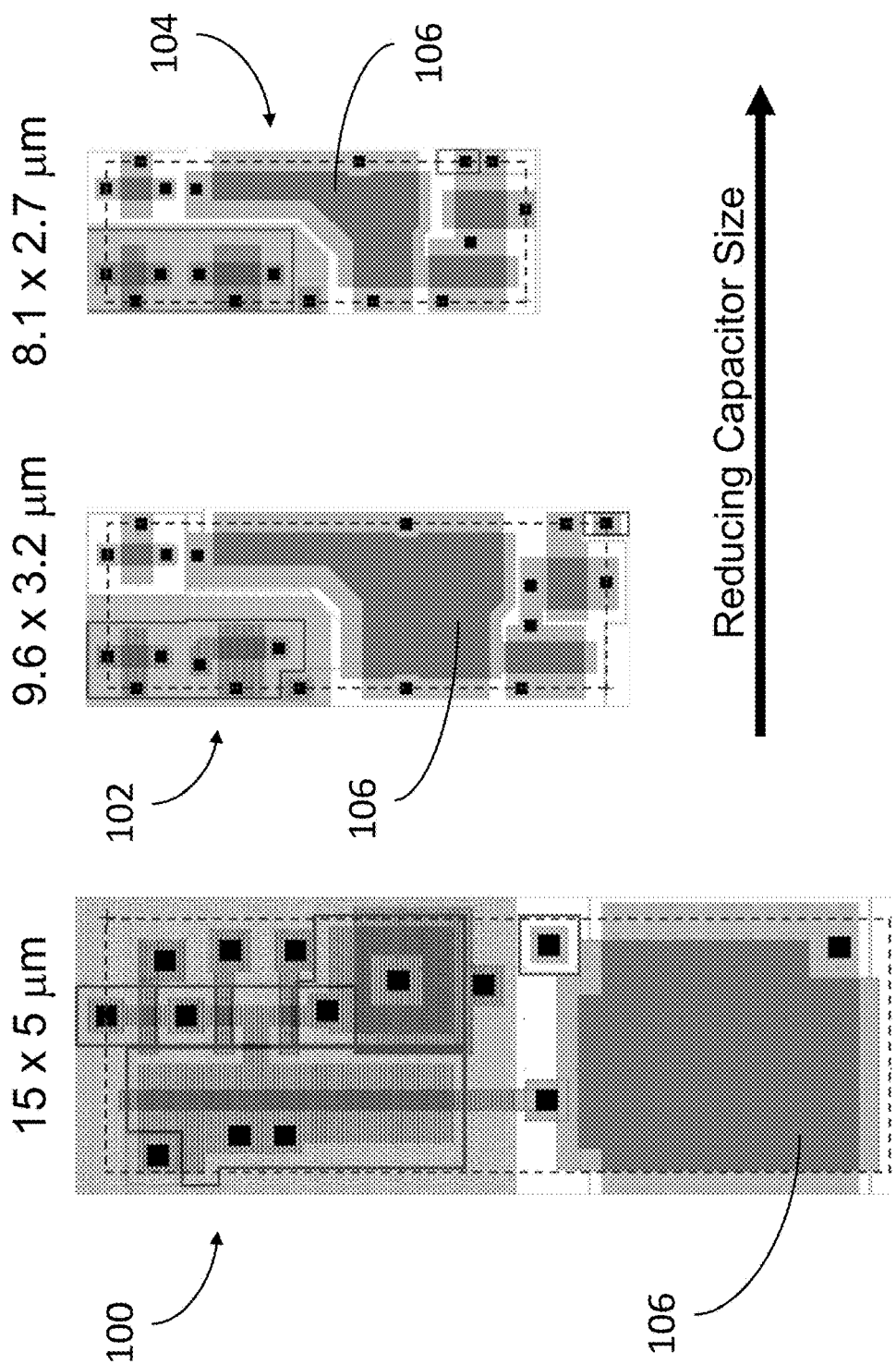
FIG. 1 are schematic drawings of pixel circuits of different sizes formed using a conventional silicon fabrication process.

FIG. 1 are schematic drawings of pixel circuits 100, 102 and 104 of different size formed using a conventional silicon fabrication process. Each pixel circuit includes five transistors and one capacitor 106. The physical dimensions of pixel circuits 100, 102 and 104 are 15 µm×5 µm, 9.6 µm×3.2 µm and 8.1 µm×2.7 µm, respectively.

The progressive reduction in pixel area for pixel circuits 100, 102 and 104 is achieved primarily by reducing the area of the storage capacitor 106. In the 8.1 µm×2.7 µm pixel circuit 104, the size of the storage capacitor 106 is the minimum acceptable value for that size pixel. Additional pixel-size reduction is difficult, if not impossible, using conventional fabrication techniques.

The present invention enables an OLED microdisplay having pixels that include small sub-pixel areas as small as 2 µm×2 µm (an area of 4 µm$^2$) or smaller. Each pixel in the array includes pixel circuitry and regions of OLED material, where the pixel circuitry and the OLED material are integrated on a substrate via a 3D silicon assembly process.

A 3D pixel is fabricated so as to be split between a single high voltage device for driving the OLED on an upper silicon layer, and a group of low voltage devices and a trench capacitor that are located on a lower silicon layer. This unique arrangement allows the large high voltage device to be physically located on top of the larger number of low voltage devices in the lower silicon layer in order to achieve a substantial reduction in overall pixel emission area. With this circuit configuration, the lower silicon layer functions can be implemented using advanced silicon technology, such as a DRAM fabrication process, which also has the benefit of allowing a vertical trench capacitor to be used for data storage, thereby further reducing the pixel area dimensions. As used herein, the term "high voltage device" or "high voltage transistor" refers to a device or transistor designed to operate at voltages greater than approximately 3 volts and the term "low voltage device" or "low voltage transistor" refers to a device or transistor that is designed to operate at voltages of approximately 3 volts or lower.

Figure 2:
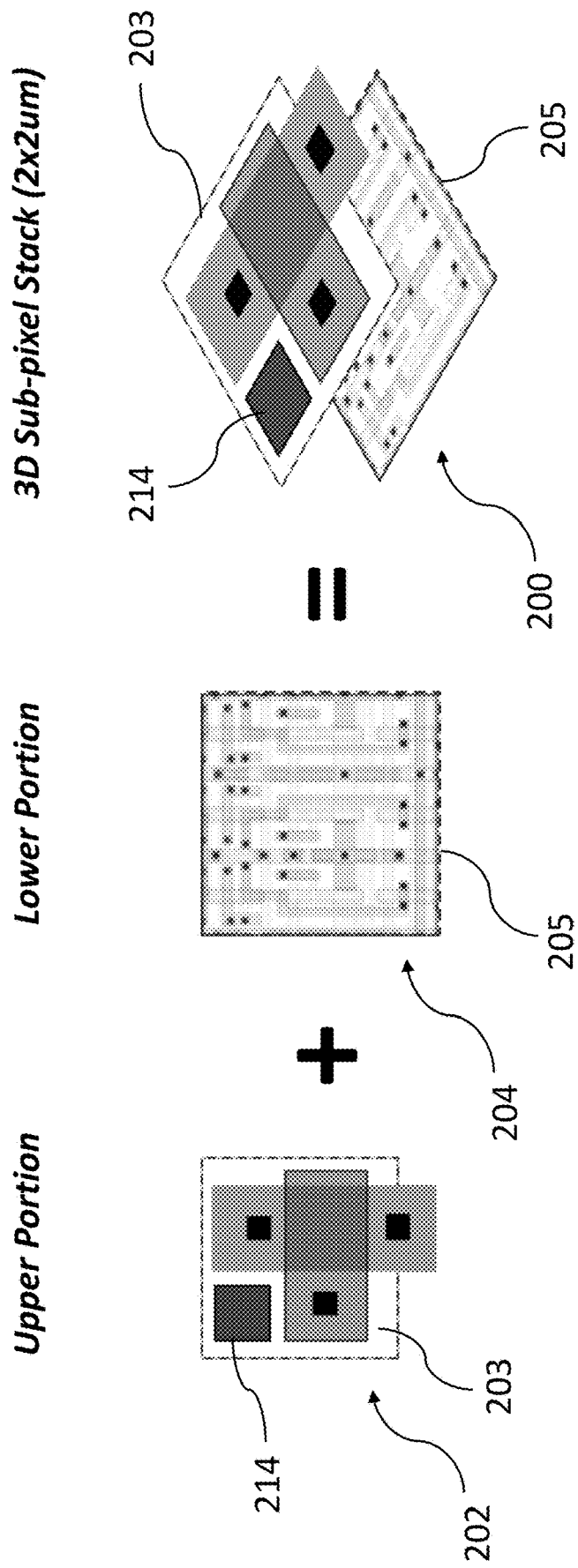
FIG. 2 is a schematic drawing of a vertically stacked pixel circuit, in accordance with an illustrative embodiment of the present invention.
Figure 3:
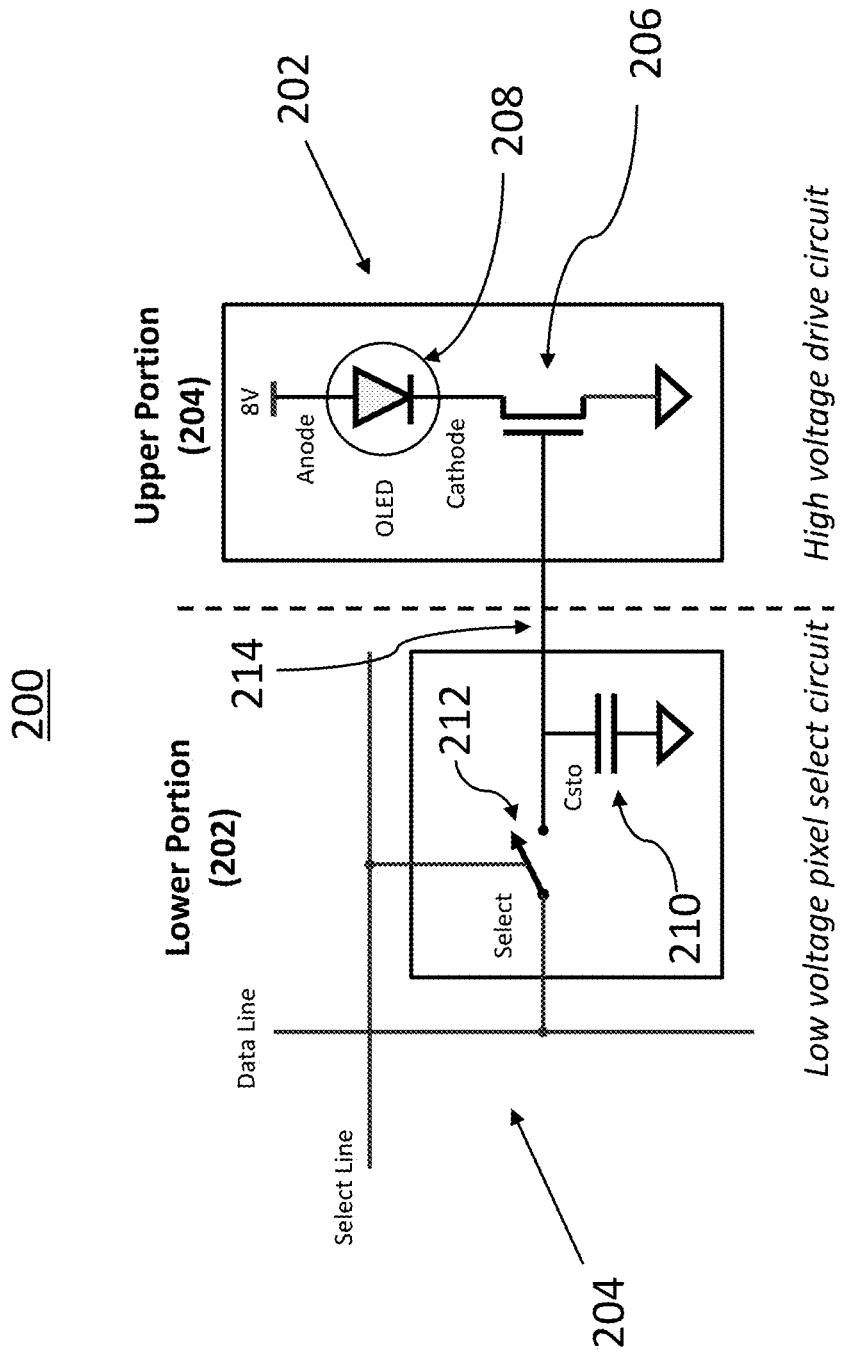
FIG. 3 is a circuit diagram of the vertically stacked pixel circuit of FIG. 2, in accordance with an illustrative embodiment of the present invention.

FIG. 2 is a schematic drawing of a vertically stacked pixel circuit 200 and FIG. 3 is a circuit diagram of the vertically stacked pixel circuit 200, in accordance with an illustrative embodiment of the present invention.

The pixel circuit 200 includes an upper portion 202 that is fabricated on an upper silicon layer 203 and a lower portion 204 that is fabricated on a lower silicon layer 205. Upper portion 202 includes a high voltage drive transistor 206, suitably a 5 volt drive transistor, and an OLED 208. The devices that make up portion 202 are preferably fabricated on a thinned silicon wafer, which includes through-silicon via (TSV) 214 at each pixel for enabling an electrical connection to the circuitry of lower portion 204.

Lower portion 204 is a low voltage pixel-select sub-circuit that is fabricated on a lower silicon layer 205 and includes matrix addressing circuitry, data storage circuitry and uniformity compensation circuitry. The data storage circuitry preferably includes a storage capacitor 210, suitably a trench capacitor. The matrix addressing circuitry preferably includes a selection switch 212, suitably a switching transistor. The uniformity compensation circuitry preferably includes low voltage transistors (not shown) used for generating a local correction signal to the input data to ensure identical brightness performance among pixels despite process or aging related variations in drive transistors 206 and/or OLEDs 208 between different pixels. All of the devices that make up lower portion 204 operate at a lower voltage than the upper portion 202, suitably approximately 1V, and are preferably fabricated using a high-density scaled-silicon process.

Thus, the pixel circuit 200 is split into a drive transistor 206 (e.g., a 5 volt transistor) at the upper portion 202 and a group of low voltage (e.g., 1 volt) devices at the lower portion 204, with only a single connection point (TSV 214) needed to electrically connect the upper and lower portions 202 and 204 for each pixel. Since the lower portion 204 is operating at a low voltage in this design, it can be readily scaled and the storage capacitor 210 at the lower portion 204 can be built in a very small area using a trench structure commonly used in DRAM chips. The pixel circuit 200 is particularly suited for implementing an OLED microdisplay having pixels that include small sub-pixel areas as small as 2 µm×2 µm (an area of 4 µm$^2$) or smaller, with each sub-pixel implemented with a respective pixel circuit 200.

Figure 4:
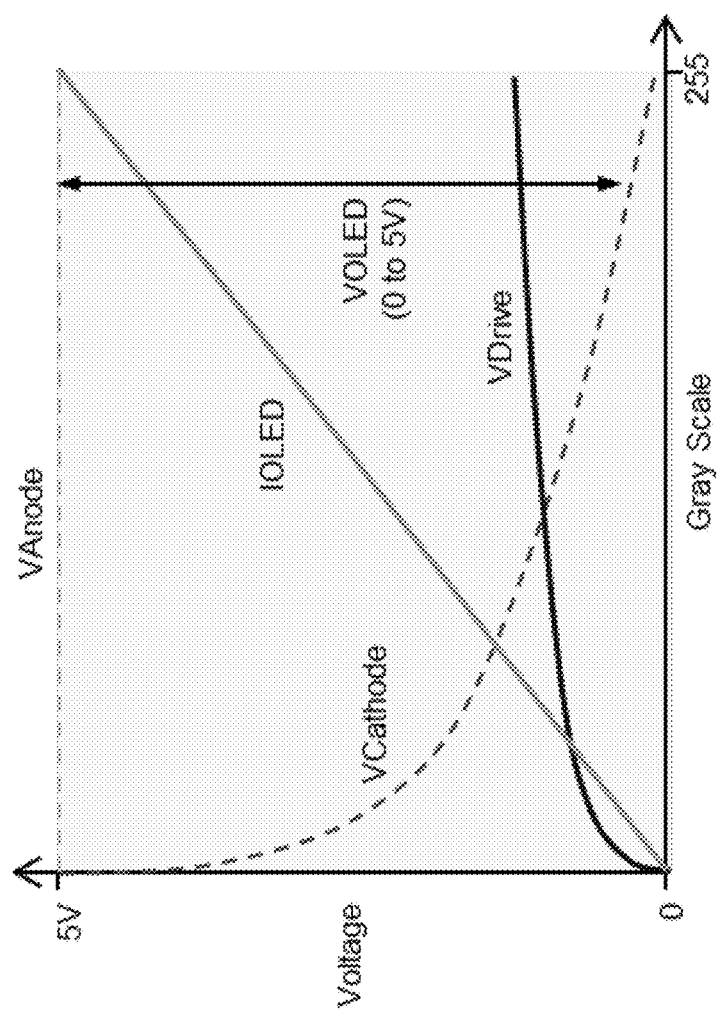
FIG. 4 is a graph showing the operating signal values for the pixel circuit of FIGS. 2 and 3, in accordance with an illustrative embodiment of the present invention.

FIG. 4 is a graph showing the operating signal values for the pixel circuit 200. "VAnode" denotes to the voltage at the anode of side of the OLED, "VCathode" denotes the voltage at the cathode side of the OLED, "IDLED" denotes the current through the OLED, "VOLED" denotes the voltage across the OLED and "VDrive" denotes the voltage applied to the gate of drive transistor 206.

Figure 5:
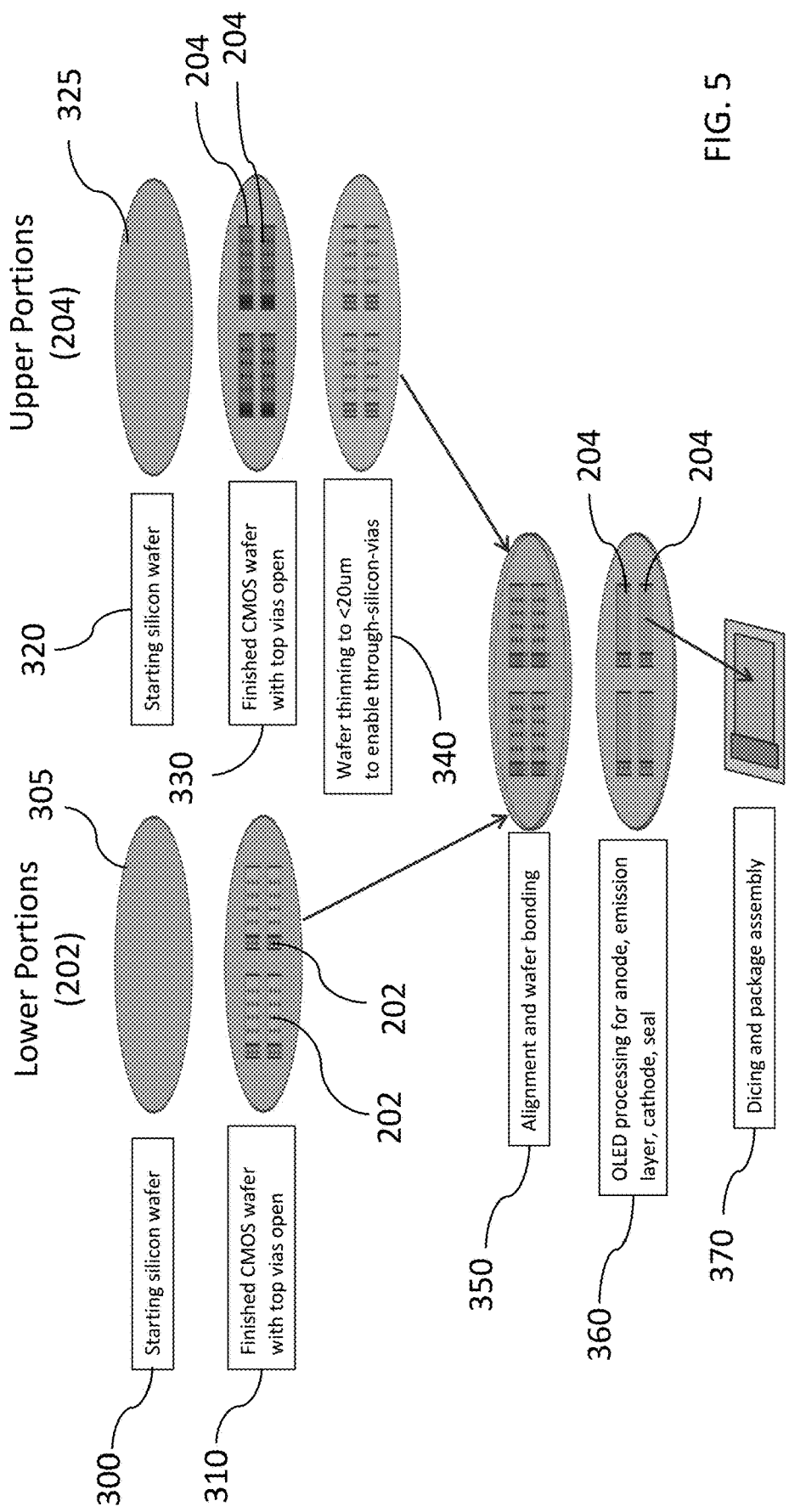
FIG. 5 is a flowchart of a fabrication method for an OLED microdisplay that utilizes the pixel circuit of FIGS. 2 and 3, in accordance with an illustrative embodiment of the present invention.

FIG. 5 is a flowchart of a fabrication method for an OLED microdisplay that utilizes the 3D pixel circuit 200, in accordance with an illustrative embodiment of the present invention. The upper portion 204 and lower portion 202 are fabricated separately using silicone fabrication processes.

With regards to the lower portion 202, at step 300 a silicon wafer 305 is provided. At step 310, the CMOS devices for multiple lower portions 202 are fabricated on the silicone wafer with top vias open that will enable the TSV 214 in each finished pixel circuit 200.

With regards to the upper portions 204, at step 320 a silicon wafer 325 is provided. At step 330, the CMOS devices for multiple upper portions 204 are fabricated on the silicone wafer with top vias open that will enable the TSV 214 in each finished pixel circuit 200. At step 340, the silicon wafer is mechanically polished so as to reduce the thickness of the silicon wafer (thinning the silicon wafer) to preferably less than 20 µm in order to enable the TSV 214.

At step 350, the silicon wafer that contains the lower portions 202 and the silicon wafer that contains the upper portions 204 are aligned and bonded. The silicon wafers are preferably bonded by using a low-temperature thermo-compression process for bonding ultra-fine pitch cu-to-cu metals used in the TSV 214. Special in-situ alignment cameras known in the art for 3D wafer bonding can be used for wafer alignment. At step 360, the OLEDs are fabricated on the upper portions 204. The OLEDs are fabricated by using evaporation and deposition techniques that are known in the art for fabricating OLEDs. Then, at step 370, the combined wafers are diced to yield multiple OLED display panels that are then assembled into a display package.

The foregoing embodiments and advantages are merely exemplary, and are not to be construed as limiting the present invention. The description of the present invention is intended to be illustrative, and not to limit the scope of the claims. Many alternatives, modifications, and variations will be apparent to those skilled in the art. Various changes may be made without departing from the spirit and scope of the invention.

What is claimed is:

1. A vertically stacked pixel circuit, comprising:
a lower portion comprising (1) low voltage circuitry that includes at least one low voltage transistor and (2) data storage circuitry that includes at least one trench capacitor; and
an upper portion, disposed above the lower portion, comprising at least one high voltage transistor and pixel drive circuitry configured to drive a first organic light-emitting diode (OLED), wherein the upper portion includes a first through-silicon via (TSV) and at least one high voltage transistor;
wherein the upper and lower portions are electrically connected via a single electrical connection point that includes the first TSV.

2. The circuit of claim 1, wherein the high voltage transistor has an operating voltage that is greater than 3 volts, and wherein the at least one low voltage transistor has an operating voltage of 3 volts or lower.

3. The circuit of claim 1, wherein the lower portion further includes (3) matrix-addressing circuitry and (4) uniformity-compensation circuitry.

4. The circuit of claim 1 wherein the upper portion is formed on a first silicon layer and the lower portion is formed on a second silicon layer, and wherein the first silicon layer and second silicon layer are bonded together.

5. The circuit of claim 1, wherein the upper portion further comprises the first OLED.

6. The circuit of claim 1, wherein a length and width of the circuit are less than 4 μm×4 μm.

7. A vertically stacked pixel circuit, comprising:
a lower portion comprising (1) low voltage circuitry that includes at least one low voltage transistor having an operating voltage of 3 volts or lower and (2) data storage circuitry that includes at least one trench capacitor; and
an upper portion, disposed above the lower portion, comprising a first organic light-emitting diode (OLED) and pixel drive circuitry configured to drive the first OLED, wherein the upper portion includes a first through-silicon via (TSV) and high voltage circuitry that includes at least one high voltage transistor having an operating voltage greater than 3 volts;
wherein the upper and lower portions are electrically connected via a single electrical connection point that includes the first TSV.

8. The pixel circuit of claim 7, wherein the lower portion further comprises matrix addressing circuitry and uniformity compensation circuitry.

9. The pixel circuit of claim 8, wherein the matrix addressing circuitry comprises a selection switch and the trench capacitor is a storage capacitor.

10. The pixel circuit of claim 7, wherein the lower portion and the upper portion are formed on respective silicon layers.

11. The pixel circuit of claim 10, wherein the silicon layer containing the lower portion and the silicon layer containing the upper portion are bonded together.

12. The pixel circuit of claim 10, wherein a length and width of the pixel circuit are less than 4 μm×4 μm.

13. A microdisplay comprising a plurality of sub-pixels, wherein each sub-pixel comprises the pixel drive circuit of claim 7.

* * * * *